United States Patent [19]
Mizui

[11] Patent Number: 5,977,005
[45] Date of Patent: Nov. 2, 1999

[54] MICROWAVE DIELECTRIC PORCELAIN COMPOSITION

[75] Inventor: Toshihiro Mizui, Ise, Japan

[73] Assignee: NGK Spark Plug Co., Ltd., Aichi, Japan

[21] Appl. No.: 09/078,551

[22] Filed: May 14, 1998

[30] Foreign Application Priority Data

May 29, 1997 [JP] Japan ................................ 9-157575

[51] Int. Cl.⁶ ................................................. C04B 35/465
[52] U.S. Cl. ................................................. 501/136
[58] Field of Search ........................................... 501/136

[56] References Cited

U.S. PATENT DOCUMENTS

| | | | |
|---|---|---|---|
| 4,438,214 | 3/1984 | Masuyama et al. | |
| 4,490,318 | 12/1984 | Masuyama et al. | 264/61 |
| 4,992,398 | 2/1991 | Huang et al. | 501/135 |
| 5,019,306 | 5/1991 | Huang et al. | |
| 5,556,818 | 9/1996 | Kohler et al. | 501/138 |

FOREIGN PATENT DOCUMENTS

| | | | |
|---|---|---|---|
| 52-118599 | 10/1977 | Japan | H01B 3/12 |
| 2-129065 | 5/1990 | Japan | C04B 35/46 |
| 4-357608 | 12/1992 | Japan . | |

OTHER PUBLICATIONS

Sreemoolanadhan et al, "Dielectric Ceramic Materials For Microwave Resonator Applications", Metal Materials and Processes, vol. 7, No. 4, 1995, pp. 251–266.

Primary Examiner—Karl Group
Attorney, Agent, or Firm—Sughrue, Mion, Zinn, Macpeak & Seas, PLLC

[57] ABSTRACT

The present invention provides a microwave dielectric porcelain composition having excellent properties, i.e., practically sufficient relative dielectric constant and unloaded Q value and a very small absolute temperature coefficient of resonant frequency. A novel microwave dielectric porcelain composition is provided, comprising a main component having a perovskite type crystalline structure represented by the general formula $(Ca_x, Sr_y, Nd_z)_{1+a}TiO_{3+b}$ [in which x, y and z each represent a molar ratio and satisfy the following relationships: $x+y+z=1$, $0.430 \leq x \leq 0.650$, $0.260 \leq y \leq 0.440$, $0.090 \leq z \leq 0.130$; a satisfies the relationship: $0.010 \leq a \leq 0.300$; and b satisfies the relationship: $0.100 \leq b \leq 1.000$], $Al_2O_3$, and at least one of oxides of elements of Ca, Sr, Nd, Ti and Al, wherein the content of $Al_2O_3$ and said oxides are from 10 to 12% by weight and from 1 to 2% by weight, respectively, based on 100% by weight of said main component. The oxides are preferably $Nb_2O_5$ and $MnO_2$.

6 Claims, 1 Drawing Sheet

MICROWAVE DIELECTRIC PORCELAIN COMPOSITION

FIELD OF THE INVENTION

The present invention relates to a microwave dielectric porcelain composition (hereinafter referred to as "dielectric porcelain composition") comprising a main component having a specific crystalline structure, $Al_2O_3$ and other oxides. The dielectric porcelain composition according to the present invention can be used as microwave circuit board, impedance matching member for various microwave circuits or the like besides as dielectric resonator in microwave range.

BACKGROUND OF THE INVENTION

A dielectric porcelain composition tends to exhibit an increased dielectric loss as the frequency used becomes high. Therefore, a dielectric porcelain composition which exhibits a high relative dielectric constant (hereinafter referred to as "$\in_r$") and a high unloaded Q value (i.e., high coefficient of unloaded quality) (hereinafter referred to as "Qu") in the microwave frequency range has been desired. As this kind of a dielectric porcelain composition there has heretofore been known one having a crystalline structure comprising two phases, i.e., perovskite phase and illmenite phase (as disclosed in JP-A-2-129065 (The term "JP-A" as used herein means an "unexamined published Japanese patent application")). A dielectric porcelain composition comprising $MgTiO_3$ and $TiO_2$ mixed with a predetermined amount of $CaTiO_3$ has been known as well (as disclosed in JP-A-52-118599).

However, the former dielectric porcelain composition is disadvantageous in that it contains a considerable amount of other components such as $Nd_2O_3$, $La_2O_3$, PbO and ZnO and doesn't always have a high $Q_u$. The latter dielectric porcelain composition comprises $TiO_2$ as an essential component and thus is disadvantageous in that the temperature coefficient of resonant frequency (hereinafter referred to as "$\in_f$") makes a great positive or negative change when the mixing ratio of $CaTiO_3$ falls within a range of from 3 to 10% by weight, making it difficult to adjust the temperature coefficient $\in_f$ to a small value close to zero.

SUMMARY OF THE INVENTION

It is therefore an object of the present invention to provide a dielectric porcelain composition which exhibits excellent dielectric properties, i.e., practically sufficient $\in_r$ and $Q_u$, particularly $Q_u$, as high as not less than 3,900, and absolute $\tau_f$ value as very small as not more 3.00 ppm/° C.

The foregoing object of the present invention will become more apparent from the following detailed description and examples.

BRIEF DESCRIPTION OF THE DRAWING

By way of example and to make the description more clear, reference is made to the accompanying drawing in which.

DETAILED DESCRIPTION OF THE INVENTION

Figure 1:
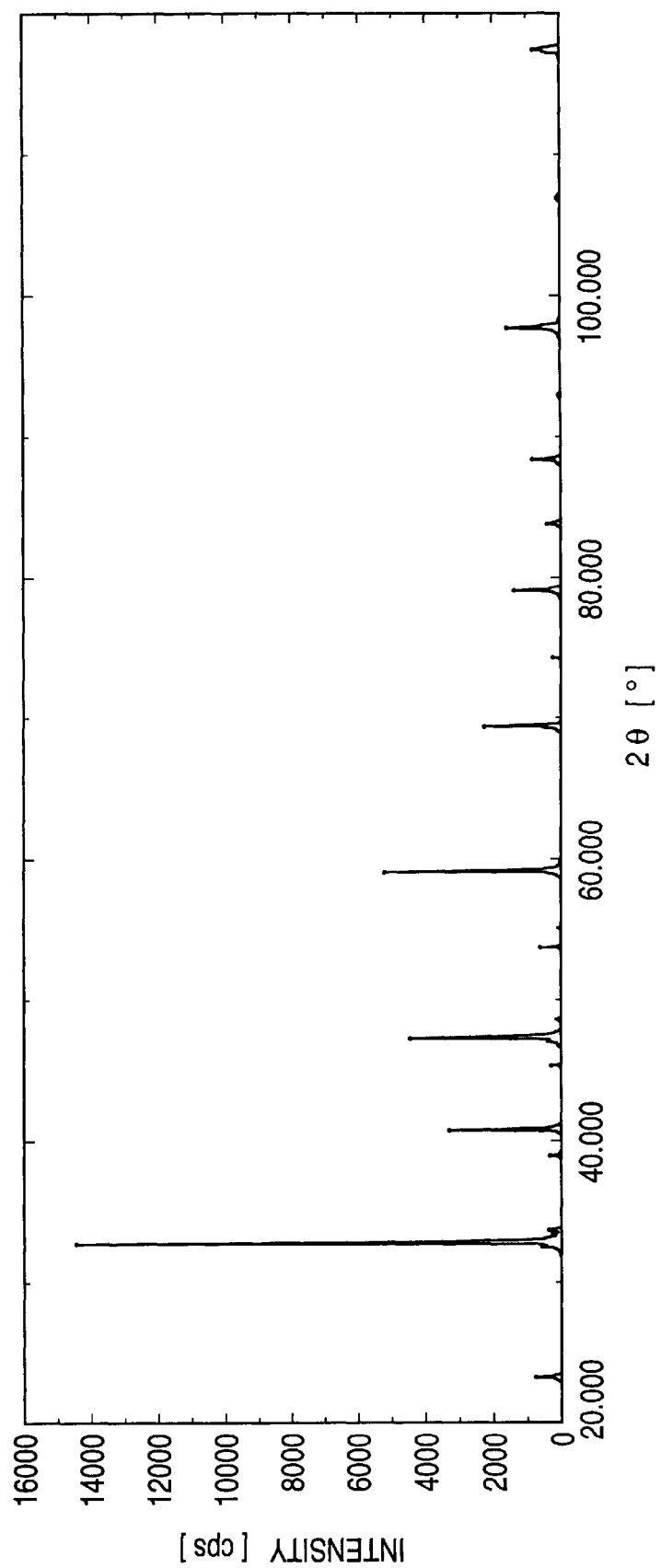
FIG. 1 is a chart illustrating the X-ray diffractometry of the dielectric porcelain composition of Experiment Example 2.

The first aspect of the present invention concerns a dielectric porcelain composition, comprising a main component having a perovskite type crystalline structure represented by the general formula $(Ca_x, Sr_y, Nd_z)_{1+a}TiO_{3+b}$ [in which x, y and z each represent a molar ratio and satisfy the following relationships: x+y+z=1, $0.430 \leq x \leq 0.650$, $0.260 \leq y \leq 0.440$, $0.090 \leq z \leq 0.130$; a satisfies the relationship: $0.010 \leq a \leq 0.300$; and b satisfies the relationship: $0.100 \leq b \leq 1.000$], $Al_2O_3$, and at least one of oxides of elements other than Ca, Sr, Nd, Ti and Al, wherein the content of $Al_2O_3$ and said oxides are from 10 to 12% by weight and from 1 to 2% by weight, respectively, based on 100% by weight of said main component.

In accordance with the present invention, the use of a dielectric porcelain composition comprising the foregoing main component and a predetermined amount of $Al_2O_3$ and other oxides provides a composition which exhibits practically sufficient dielectric properties, i.e., $\in_r$ of not less than 40, particularly not less than 43, and $Q_u$ of not less than 3,000, particularly not less than 3,500. In particular, the dielectric porcelain composition according to the present invention can be provided with an absolute $\tau_f$ value of not more than 10 ppm/° C., particularly not more than 5.00 ppm/° C., more preferably not more than 3.00 ppm/° C. Thus, a dielectric porcelain composition having very excellent properties can be provided.

The foregoing main component having a perovskite type crystalline structure represented by the foregoing general formula $(Ca_x, Sr_y, Nd_z)_{1+a}TiO_{3+b}$ can be produced by blending Ca, Sr, Nd and Ti oxides as they are or compounds which can become oxides when heated, such as carbonates of these elements, e.g., $CaCO_3$ and $SrCO_3$, in the form of powder, and then sintering the blend. The incorporation of $Al_2O_3$ and the foregoing oxides into the main component can be accomplished by blending the main component with oxides of Al and the foregoing elements as they are or by blending the main component with Al and compounds of these elements which can become oxides when heated, such as carbonates of these elements, and then sintering the blend.

If the foregoing suffix x falls below 0.430, the resulting dielectric porcelain composition exhibits a reduced $Q_u$ value. On the contrary, if the foregoing suffix x exceeds 0.650, $\tau_f$ increases beyond +10 ppm/° C. If the foregoing suffix y falls below 0.260, $\tau_f$ increases beyond +10 ppm/° C. On the contrary, if the foregoing suffix y exceeds 0.440, the resulting dielectric porcelain composition exhibits a reduced $Q_u$ value. If the foregoing suffix z falls below 0.090, $\tau_f$ increases beyond +10 ppm/° C. to the positive side. On the contrary, if the foregoing suffix z exceeds 0.130, $\tau_f$ decreases beyond −10 ppm/° C. to the negative side.

On the other hand, if the content of $Al_2O_3$ falls below 10% by weight, the resulting dielectric porcelain composition exhibits a drastically reduced $Q_u$ value. On the contrary, if the content of $Al_2O_3$ exceeds 12% by weight, the resulting dielectric porcelain composition tends to exhibit a reduced $Q_u$ value and a $\tau_f$ value which increases towards positive side more than in the case where the suffixes x, y and z deviate from the above defined range.

Examples of the foregoing oxides include $Nb_2O_5$, $Ta_2O_5$, $MnO_2$, ZnO, $Sb_2O_3$, and $Y_2O_3$. If the content of these oxides falls below 1% by weight, the resulting blend exhibits a deteriorated sinterability. In particular, if no oxides are incorporated in the blend, the resulting blend exhibits an insufficient sinterability that makes it impossible to obtain the desired dielectric porcelain composition. On the contrary, if the content of these oxides exceeds 2% by weight, the resulting dielectric porcelain composition exhibits a drastically reduced $Q_u$ value.

As these oxides there are preferably used $Nb_2O_5$ and $MnO_2$ in combination as claimed in the second aspect of the present invention. If these oxides are used, the powder to be used as starting material exhibits an improved sinterability that makes it easy to obtain a dielectric porcelain composition having excellent dielectric properties. In particular, the incorporation of $Nb_2O_5$ makes it possible to provide stabilized properties even if the blend is sintered in a wide temperature range and obtain a sintered product having a high denseness. The content of $Nb_2O_5$ is preferably from 0.5 to 2.0% by weight, particularly from 0.7 to 1.5% by weight. The content of $MnO_2$ is preferably from 0.05 to 0.3% by weight, particularly from 0.05 to 0.25% by weight. If the content of $Nb_2O_5$ and $MnO_2$ fall within the above defined range, the blend can be sintered more stably, and a dielectric porcelain composition having well-balanced excellent properties can be obtained.

The third aspect of the present invention concerns a dielectric porcelain composition having the composition claimed in the first aspect, wherein x satisfies the relationship $0.580 \leq x \leq 0.630$, y satisfies the relationship $0.260 \leq y \leq 0.330$, z satisfies the relationship $0.100 \leq z \leq 0.115$, the relative dielectric constant thereof is from 43.00 to 45.30, the unloaded Q value thereof is from 3,700 to 4,200, and the temperature coefficient of resonant frequency is from −5.00 to +5.00 ppm/° C. The fourth aspect of the present invention concerns a dielectric porcelain composition having the composition claimed in the first aspect, wherein x satisfies the relationship $0.580 \leq x \leq 0.625$, y satisfies the relationship $0.265 \leq y \leq 0.320$, z satisfies the relationship $0.100 \leq z \leq 0.115$, the relative dielectric constant thereof is from 43.00 to 44.30, the unloaded Q value thereof is from 3,900 to 4,200, and the temperature coefficient of resonant frequency is from −3.00 to −1.50 ppm/° C.

In accordance with the present invention, as claimed in the third and fourth aspects of the present invention, further specification of x, y and z makes it possible to obtain a dielectric porcelain composition having better dielectric properties. In the third aspect of the present invention, $Q_u$ and absolute $\tau_f$ value can be predetermined to not less than 3,700 and not more than 5.00 ppm/° C., respectively. In the fourth aspect of the present invention, $Q_u$ and absolute $\tau_f$ value can be predetermined to not less than 3,900 and not more than 3.00 ppm/° C., respectively. Thus, a dielectric porcelain composition having very excellent dielectric properties can be obtained.

The present invention will be further described in the following examples, but the present invention should not be construed as being limited thereto.

(1) Examination of Ratio of x, y and z

As starting materials there were used $Nd_2O_3$ powder (purity: 99.9%), $Al_2O_3$ powder (purity: 99.9%), $CaCO_3$ powder (purity: 99.5%), $SrCO_3$ powder (purity: 97.0%), $TiO_2$ powder (purity: 99.98%), $Nb_2O_5$ powder (purity: 99.9%) and $MnO_2$ powder (purity: 96.0%).

These starting materials were measured out in amounts such that x, y and z in the composition formula $(Ca_x, Sr_y, Nd_z)_{1+a}TiO_{3+b}$ are as set forth in the column of Experiment Examples 1 to 26 in Table 1 and the content of $Al_2O_3$, $Nb_2O_5$ and $MnO_2$ are as set forth in the column of Experiment Examples 1 to 26 in Table 1, and then mixed.

TABLE 1

| | x | y | z | a | b | $Al_2O_3$ (wt %) | $Nb_2O_5$ (wt %) | $MnO_2$ (wt %) |
|---|---|---|---|---|---|---|---|---|
| 1 | 0.600 | 0.296 | 0.104 | 0.245 | 0.889 | 10.66 | 1.0 | 0.1 |
| 2 | 0.581 | 0.313 | 0.106 | 0.237 | 0.895 | 10.78 | " | " |
| 3 | 0.600 | 0.295 | 0.105 | 0.216 | 0.852 | 10.65 | " | " |
| 4 | 0.596 | 0.293 | 0.111 | 0.125 | 0.750 | 10.81 | " | " |
| 5 | 0.601 | 0.296 | 0.103 | 0.243 | 0.882 | 10.80 | " | " |
| 6 | 0.596 | 0.295 | 0.107 | 0.208 | 0.857 | 10.83 | " | " |
| 7 | 0.574 | 0.309 | 0.117 | 0.133 | 0.797 | 11.20 | " | " |
| 8 | 0.603 | 0.297 | 0.100 | 0.227 | 0.844 | 10.39 | " | " |
| 9 | 0.622 | 0.267 | 0.111 | 0.125 | 0.750 | 10.88 | " | " |
| 10 | 0.585 | 0.315 | 0.100 | 0.257 | 0.882 | 10.35 | " | " |
| 11 | 0.624 | 0.267 | 0.109 | 0.122 | 0.731 | 10.70 | " | " |
| 12 | 0.560 | 0.329 | 0.111 | 0.125 | 0.750 | 10.72 | " | " |
| 13 | 0.444 | 0.444 | 0.112 | 0.125 | 0.750 | 10.45 | " | " |
| 14 | 0.600 | 0.296 | 0.104 | 0.214 | 0.844 | 10.80 | " | " |
| 15 | 0.581 | 0.313 | 0.106 | 0.236 | 0.887 | 10.93 | " | " |
| 16 | 0.640 | 0.240* | 0.120 | 0.105 | 0.769 | 11.33 | " | " |
| 17 | 0.600 | 0.340 | 0.060* | 0.169 | 0.519 | 10.88 | " | " |
| 18 | 0.440 | 0.460* | 0.100 | 0.206 | 0.812 | 10.25 | " | " |
| 19 | 0.480 | 0.360 | 0.160* | 0.045 | 0.883 | 11.29 | " | " |
| 20 | 0.420* | 0.460* | 0.120 | 0.211 | 0.817 | 10.89 | " | " |
| 21 | 0.680* | 0.230* | 0.090 | 0.048 | 0.493 | 11.44 | " | " |
| 22 | 0.598 | 0.295 | 0.107 | 0.206 | 0.849 | 10.97 | " | " |
| 23 | 0.610 | 0.260 | 0.130 | 0.153 | 0.903 | 10.31 | " | " |
| 24 | 0.650 | 0.260 | 0.090 | 0.043 | 0.552 | 11.54 | " | " |
| 25 | 0.470 | 0.440 | 0.090 | 0.203 | 0.747 | 10.45 | " | " |
| 26 | 0.430 | 0.440 | 0.130 | 0.140 | 0.881 | 10.45 | " | " |

These powders were dry-blended by a mixer for 20 to 30 minutes, and then subjected to primary grinding by an oscillating mill. As the pebble there was used an alumina ball having a diameter of 20 mm. The grinding time was 4 hours. The powder blend thus obtained was then calcinated at a temperature of from 1,100° C. to 1,350° C. in the atmosphere. For the calcination, a tunnel kiln was used. The truck speed was 55 minutes/truck. The time during which the above mentioned temperature is kept was from 2 to 5 hours. Subsequently, to the powder thus calcinated were added a proper amount of an organic binder and water. The mixture was then subjected to secondary grinding by a Trommel mill. As the pebble there was used an alumina ball having a diameter of 20 mm. The grinding time was 6 hours.

Thereafter, the powder blend thus processed was dried and granulated by a spray dryer. The spray dryer was adjusted such that the temperature of the hot air inlet of was not higher than 360° C. and the temperature of the exhaust gas outlet was from 90° C. to 110° C. The material thus granulated was then sieved to obtain a powder having a grain size of from 40 to 200 meshes. The powder thus obtained was then compressed under a 5-ton manual press to prepare a columnar molded product having a diameter of 19 mm and a thickness of 11 mm. The press pressure was 3 tons. The molding pressure was 1 ton/cm².

The molded product thus obtained was then degreased at a temperature of 500° C. in the atmosphere for 3 hours. Thereafter, the molded product thus degreased was sintered at a temperature of 1,450° C. to 1,700° C. in a single kiln in the atmosphere for 2 to 6 hours. The sintered product was then polished at both ends thereof by a diamond grinding wheel on a rotary lapping machine to obtain a column having a diameter of about 19 mm and a thickness of 8 mm. The columnar sintered product was measured for $\in_r$, $Q_u$ and $\tau_f$ by the Hakki and Coleman method (see Denesh C. Dube, Rudolf Zurmuhien, Andrew Bell and Nava Setter, "Dielectric Measurements on High-Q Ceramics in the Microwave Region" J.Am.Ceram.Soc., 80 [5] 1095–1100 ($TE_{011}$MODE) or the like.

The measurement of $\tau_f$ was effected at a temperature of from 25° C. to 80° C. The value of $\tau$ was calculated by the equation $\tau_f=(f_{80}-f_{25})/(f_{25}\times\Delta T)$ wherein $\Delta T$ is 55° C. (80° C. −25° C.). The resonant frequency during measurement was 4 GHz. The results of $\in_r$, $Q_u$ and $\tau_f$ are set forth in Table 2.

TABLE 2

| | $\epsilon_r$ | $Q_u$ (4 GHz) | $\tau_f$ (ppm/° C.) |
|---|---|---|---|
| 1 | 42.67 | 3,683 | +5.42 |
| 2 | 43.08 | 4,170 | −0.11 |
| 3 | 43.16 | 3,711 | −3.18 |
| 4 | 43.17 | 3,910 | +0.64 |
| 5 | 43.34 | 4,174 | +1.76 |
| 6 | 43.39 | 4,128 | −3.22 |
| 7 | 43.57 | 3,938 | −4.64 |
| 8 | 43.91 | 3,848 | +4.74 |
| 9 | 43.91 | 3,964 | −0.74 |
| 10 | 43.95 | 3,961 | +8.03 |
| 11 | 44.17 | 3,957 | +1.85 |
| 12 | 45.25 | 3,808 | +3.50 |
| 13 | 46.64 | 3,225 | +8.81 |
| 14 | 43.88 | 4,104 | −0.07 |
| 15 | 43.29 | 4,154 | −1.35 |
| 16 | 45.20 | 3,689 | **+13.24 |
| 17 | 43.46 | 3,793 | **+16.11 |
| 18 | 45.03 | **2,416 | +6.18 |
| 19 | 42.87 | 3,351 | **−13.42 |
| 20 | 43.44 | **2,043 | +7.23 |
| 21 | 43.92 | 3,735 | **+12.14 |
| 22 | 43.54 | 4,129 | −4.31 |
| 23 | 45.11 | 3,793 | +9.12 |
| 24 | 44.36 | 3,321 | +9.43 |
| 25 | 42.98 | 3,613 | +8.21 |
| 26 | 43.11 | 3,522 | −7.93 |

The results set forth in Table 2 show that the products of Experiment Examples 1 to 15 and 22 to 26 according to the first aspect of the present invention exhibit $\in_r$ of not less than 42.67, $Q_u$ of not less than 3,225 and absolute $\tau_f$ of not more than 9.43 ppm/° C., providing dielectric porcelain compositions having practically sufficient dielectric properties. In particular, the products of Experiment Examples 2 to 9, 11, 12, 14, 15 and 22 according to the third aspect of the present invention exhibit $\in_r$ of not less than 43.08, $Q_u$ of not less than 3,711 and absolute $\tau_f$ of not more than 4.74 ppm/° C., providing dielectric porcelain compositions having better dielectric properties. Further, the products of Experiment Examples 2, 4, 5, 9, 11, 14, and 15 according to the fourth aspect of the present invention exhibit $Q_u$ of not less than 3,910 and absolute $\tau_f$ of not more than 1.85 ppm/° C., providing dielectric porcelain compositions having even better dielectric properties.

On the other hand, Experiment Example 16, wherein y falls below the lower limit, and Experiment Example 17, wherein z falls below the lower limit, exhibit a slightly low $Q_u$ value and a $\tau_f$ value which shifts towards the positive side. Experiment Example 18, wherein y exceeds the upper limit, exhibits a drastically reduced $Q_u$ value. Experiment Example 19, wherein z exceeds the upper limit, exhibits a $\tau_f$ which shifts towards the negative side. Experiment Example 20, wherein x falls below the lower limit and y exceeds the upper limit, exhibits a drastically reduced $Q_u$ value and absolute $\tau_f$ value which tends to shift towards the positive side. Experiment Example 21, wherein x exceeds the upper limit and y falls below the lower limit, exhibits a $\tau_f$ value which shifts towards the positive side.

FIG. 1 is a chart illustrating the X-ray diffractometry of the dielectric porcelain composition of Experiment Example 2. The dielectric porcelain composition was identified by the use of a JCPDS card. As a result, it was found that the composition shown on the diffraction chart is $CaTiO_3$ having a perovskite type crystalline structure. Thus, the dielectric porcelain composition according to the present invention was identified comprising a perovskite type crystalline structure.

(2) Examination of Ratio of $Al_2O_3$ and Oxides

The value of $\in_r$, $Q_u$ and $\tau_f$ were measured with the change of the content of $Al_2O_3$, $Nb_2O_5$ and $MnO_2$ with the composition of Experiment Example 14 of Table 1 as base composition. Dielectric porcelain compositions were prepared from these compositions in the same manner as in Clause (1). The dielectric porcelain compositions thus prepared were then measured for dielectric properties in the same manner as in Clause (1). The results of the composition and the measurement of dielectric properties are set forth in Table 3.

TABLE 3

| Basic composition (No. 14) | | $Al_2O_3$ (wt %) | Oxide (wt %) | | $\epsilon_r$ | $Q_u$ (4 GHz) | $\tau_f$ (ppm/° C.) |
|---|---|---|---|---|---|---|---|
| x = 0.600 | No. 14 | 10.80 | $Nb_2O_5$ | 1.0 | 43.88 | 4,104 | −0.07 |
| y = 0.296 | | | $MnO_2$ | 0.1 | | | |
| z = 0.104 | (1) | 8.81 | $Nb_2O_5$ | 1.0 | 44.32 | 1,692 | +5.41 |
| z = 0.214 | | | $MnO_2$ | 0.1 | | | |
| b = 0.844 | (2) | 13.92 | $Nb_2O_5$ | 1.0 | 46.06 | 3,035 | +19.21 |
| | | | $MnO_2$ | 0.1 | | | |
| | (3) | 10.80 | — | | | Undersintered | |
| | (4) | 10.80 | $Nb_2O_5$ | 4.0 | 44.76 | 2,441 | +8.86 |
| | | | $MnO_2$ | 0.1 | | | |
| | (5) | 10.80 | $Nb_2O_5$ | 1.0 | 43.91 | 2,124 | +3.92 |
| | | | $MnO_2$ | 2.0 | | | |

The results set forth in Table 3 show that the product (1), wherein the content of $Al_2O_3$ falls below the lower limit, exhibits a drastically reduced $Q_u$ value and the product (2), wherein the content of $Al_2O_3$ exceeds the upper limit, exhibits a $\tau_f$ value which greatly shifts towards the positive side. The product (3), free of $Nb_2O_5$ and $MnO_2$, could not provide a sintered product. In some detail, those having an oxide content exceeding the upper limit, i.e., the product (4), wherein the content of $Nb_2O_5$ is as excessive as 4% by weight, and the product (5), wherein the content of $MnO_2$ is as excessive as 2% by weight, exhibit a drastically reduced $Q_u$ value.

The form of the dielectric porcelain composition according to the present invention is not limited to the foregoing specific embodiments and may be varied within the scope of the present invention depending on the purpose. For example, as the starting materials of Ca component and Sr component there may be used peroxides, hydroxides and nitrates of Ca and Sr besides $CaCO_3$ and $SrCO_3$. Similarly, as the other oxides there may be also used various compounds which become oxides when heated.

The dielectric porcelain composition according to the first aspect of the present invention has a perovskite type crystalline structure and thus can exhibit practically sufficient dielectric properties. In accordance with the third and fourth aspects of the present invention, further specification of the composition makes it possible to obtain a dielectric porcelain composition having a higher $\in_r$ value, a higher $Q_u$ value and a lower absolute $\tau_f$ value.

While the invention has been described in detail and with reference to specific embodiments thereof, it will be apparent to one skilled in the art that various changes and modifications can be made therein without departing from the spirit and scope thereof.

What is claimed is:

1. A microwave dielectric porcelain composition, which comprises:

a main component having a perovskite type crystalline structure represented by the general formula $(Ca_x, Sr_y, Nd_z)_{1+a}TiO_{3+b}$, wherein x, y and z each represents a molar ratio and satisfy the following relationships: $x+y+z=1$, $0.430 \leq x \leq 0.650$, $0.260 \leq y \leq 0.440$, $0.090 \leq z \leq 0.130$; a satisfies the relationship: $0.010 \leq a \leq 0.300$; and b satisfies the relationship: $0.100 \leq b \leq 1.000$;

$Al_2O_3$; and at least one of oxides of elements other than Ca, Sr, Nd, Ti and Al, wherein the content of $Al_2O_3$ and said at least one of oxides of elements other than Ca, Sr, Nd, Ti and Al are from 10 to 12% by weight and from 1 to 2% by weight, respectively, based on 100% by weight of the main component.

2. The microwave dielectric porcelain composition according to claim 1, wherein said at least one of oxides of elements other than Ca, Sr, Nd, Ti and Al are $Nb_2O_5$ and $MnO_2$.

3. The microwave dielectric porcelain composition according to claim 1, wherein x satisfies the relationship $0.580 \leq x \leq 0.630$, y satisfies the relationship $0.260 \leq y \leq 0.330$, z satisfies the relationship $0.100 \leq z \leq 0.115$, the relative dielectric constant thereof is from 43.00 to 45.30, the unloaded Q value thereof is from 3,700 to 4,200, and the temperature coefficient of resonant frequency is from −5.00 to +5.00 ppm/° C.

4. The microwave dielectric porcelain composition according to claim 2, wherein x satisfies the relationship $0.580 \leq x \leq 0.630$, y satisfies the relationship $0.260 \leq y \leq 0.330$, z satisfies the relationship $0.100 \leq z \leq 0.115$, the relative dielectric constant thereof is from 43.00 to 45.30, the unloaded Q value thereof is from 3,700 to 4,200, and the temperature coefficient of resonant frequency is from −5.00 to +5.00 ppm/° C.

5. The microwave dielectric porcelain composition according to claim 3, wherein x satisfies the relationship $0.580 \leq x \leq 0.625$, y satisfies the relationship $0.265 \leq y \leq 0.320$, z satisfies the relationship $0.100 \leq z \leq 0.115$, the relative dielectric constant thereof is from 43.00 to 44.30, the unloaded Q value thereof is from 3,900 to 4,200, and the temperature coefficient of resonant frequency is from −3.00 to −1.50 ppm/° C.

6. The microwave dielectric porcelain composition according to claim 4, wherein x satisfies the relationship $0.580 \leq x \leq 0.625$, y satisfies the relationship $0.265 \leq y \leq 0.320$, z satisfies the relationship $0.100 \leq z \leq 0.115$, the relative dielectric constant thereof is from 43.00 to 44.30, the unloaded Q value thereof is from 3,900 to 4,200, and the temperature coefficient of resonant frequency is from −3.00 to −1.50 ppm/° C.

* * * * *